United States Patent [19]
Beutler

[11] Patent Number: 6,003,146
[45] Date of Patent: Dec. 14, 1999

[54] METHOD AND APPARATUS OF APPLYING CRC TO ARINC 429 PERIODIC DATA

[75] Inventor: Arthur D. Beutler, Phoenix, Ariz.

[73] Assignee: Honeywell Inc., Minneapolis, Minn.

[21] Appl. No.: 08/967,715

[22] Filed: Nov. 10, 1997

[51] Int. Cl.⁶ ........................................ G06F 11/00
[52] U.S. Cl. ........................... 714/701; 714/752; 714/758
[58] Field of Search .................................. 371/2.1, 37.01, 371/37.07; 714/701, 752, 758

[56] References Cited

U.S. PATENT DOCUMENTS

| | | |
|---|---|---|
| 4,316,284 | 2/1982 | Howson . |
| 4,633,473 | 12/1986 | Ratchford et al. . |
| 5,745,479 | 4/1998 | Burns et al. ............................. 370/245 |

OTHER PUBLICATIONS

Weissberger, A.J.: "An LSI Implementation of an Intelligent CRC Computer and Programmable Character Comparator," IEEE Transactions on Computers, vol. C–29, No. 2, Feb. 1980, pp. 116–124, XP–000757804, see p. 118 (even pages only).

Hoyme K. et al: "ARINC 629 and SAFEbus*: Data Buses for Commercial Aircraft," Scientific Honeyweller, vol. 11, No. 1, Jan. 1, 1991, pp. 57–69, XP–000289742, see p. 58, right–hand column, line 10, p. 60, left–hand column, line 25 (odd pages only).

*Primary Examiner*—Phung M. Chung

[57] ABSTRACT

A method provides an error detection of periodic aircraft data transmitted between a sending unit and a receiving unit. A keyword is sent as the last word of the data being transmitted. The receiving unit receives the data and performs an error detection on data with keywords thus sued for synchronization.

12 Claims, 4 Drawing Sheets

METHOD AND APPARATUS OF APPLYING CRC TO ARINC 429 PERIODIC DATA

FIELD OF THE INVENTION

The present invention relates to periodic error checking of data in an ARINC 429 data bus.

BACKGROUND OF THE INVENTION

The ARINC 429 data bus is used for transmission of data between avionics units. The bus is a broadcast bus with one transmitter transmitting to multiple receivers. The data path between the sending and receiving units includes many elements such as a transmitter, receiver, input/output controller, memory, and processor interface electronics. An error could be introduced during transmission through any of these elements. If errors are undetected, there could be serious consequences in critical flight avionics applications. This often leads to the incorporation of costly additional redundancy.

A Cyclic Redundancy Check (CRC) exists to check the data transmitted on an ARINC 429 bus and provide the critical means necessary to detect for errors. CRCs are well known in the data communications area of technology. The CRC is performed by defining a dividend based on the data to be checked. The resultant remainder is the CRC. Usually, the CRC is added at the end of the data when it is transmitted. The integrity of the checked data can be verified on the receiving end by reassembling the data, computing the CRC, and comparing it to the received CRC attached to the data. If the CRCs match then no error exists.

Data can be sent over the bus periodically or aperiodically. Aperiodic data is event driven which means that data is requested and in reply to the request, data is sent. Currently, aperiodic data is transmitted in the ARINC 429 as blocks of data which can be thought of as a pulse of data. FIG. 1 shows aperiodic data which has a start, designated by a header, and an end, designated by an end, with data words in between. With aperiodic data, the end of the block is where the CRC information is embedded.

A label is used to give a designation to the data. At the receiving unit, desired data to be checked is identified and sampled by the data label. Sampling is basically retrieving data based on the label desired. Once the data is sampled, the data is retrieved so that a CRC is performed. All aperiodic data in a block has the same label. Therefore, each data word in the block has the same label attached to it. Due to the format of the block, it is important to keep track of the sequence the data is sent so that it may arrive at the receiving unit in the same block order.

Periodic data, on the other hand, is sent periodically with the data words sent in any order and not in the form of a block. The transmission is time critical and clock driven. However, with this type of databus and associated avionics architecture, the clocks of the transmitting and receiving units are not synchronized. As a result, the data could be sampled such that the received CRC check word corresponds to a different data set than the sampled data set. The CRC computed would not match the CRC attached and an error signal would be sent when in fact, an error may not truly exist. Without a synchronization mechanism, this occurs often enough to render CRC checking unsafe.

FIG. 2 shows an example of erroneous sampling which is symbolized by the dashes. As stated before, this erroneous sampling results in errors detected incorrectly.

Each block of five words represents a message and associated CRC. The horizontal line with an arrowhead indicates the direction the data is moving. Therefore, block A moves through the databus first, and then block B and then block C. As can be seen in block B, for example, one word from block A data set is sampled along with an incomplete block B data. This results in an inconsistent sampled data set and consequent erroneous failure of the CRC.

As a result, it would be beneficial and critical to have a means available for CRC integrity checking for periodic data which overcomes the inherent limitations of asynchronous sampling.

SUMMARY OF THE INVENTION

A method is disclosed of providing an error free error detection of critical aircraft data transmitted periodically from a sending unit over a data bus to a receiving unit. The error free aspect of the method is provided for by designating a key word at the end of a packet of data to be sent by the sending unit. The packet of data is then sent through the datastream in the databus and the receiving unit receives the packets of data sent. The receiving unit is preprogrammed to sample the data upon receipt of the keyword and the error detection is performed on the sampled packets of data.

DETAILED DESCRIPTION OF THE PRESENT INVENTION

Figure 3:
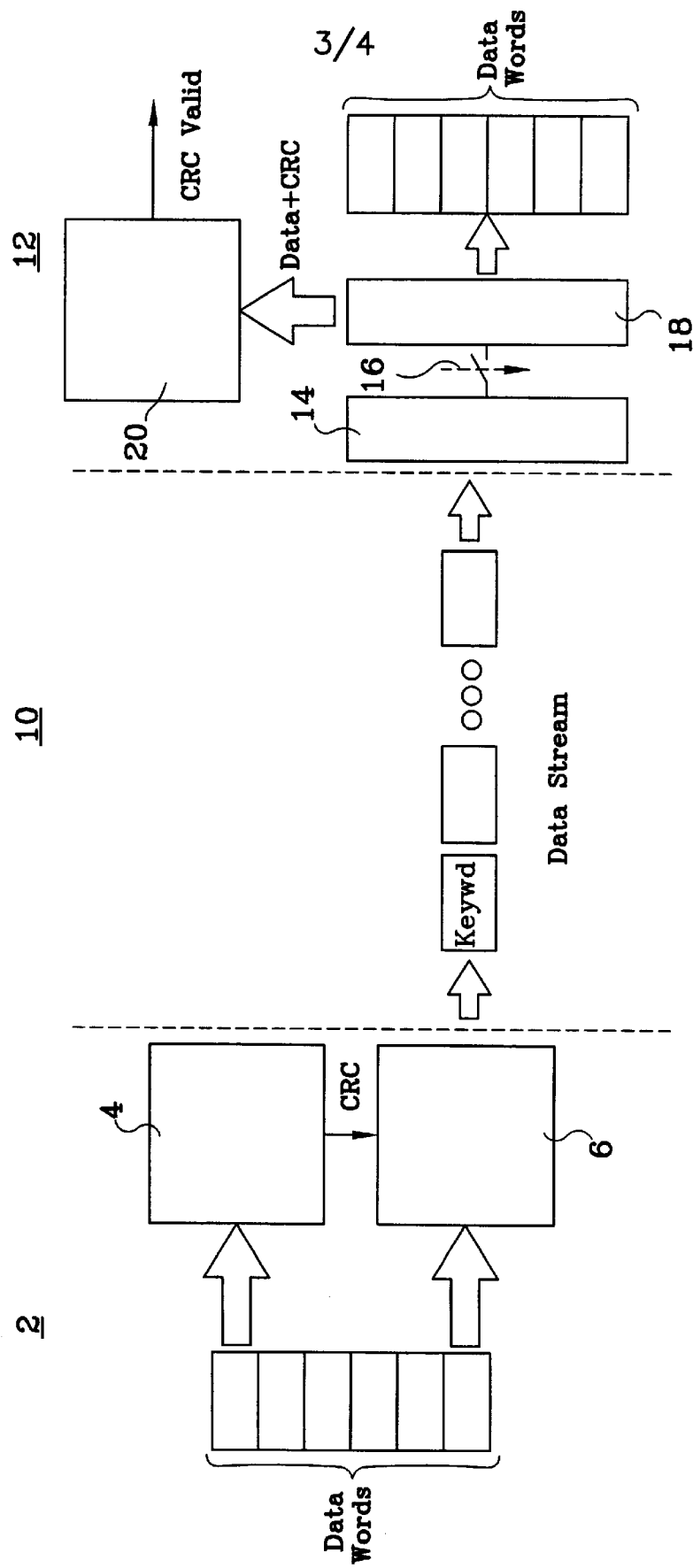
FIG. 3 shows the architecture of the present invention.

A method is disclosed to provide CRC integrity for ARINC 429 periodic data. FIG. 3 shows the structure required to perform this method. A transmission unit 2 transmits a data message made of a plurality of data words. Transmission units are well known in this area of technology and any ARINC 429 transmission unit which transmits aircraft data can be used. The message is sent to a means for determining the CRC 4. Once the CRC is determined for the message, it is sent to a formatting and transmitting means 6 that adds the CRC to the message. In the method of the present invention, a keyword, designated by a specific label, is the designation of the end of the data message. The data message along with the CRC and the keyword is called a packet of data. The keyword may be transmitted as part of the data message words or the CRC, but must be transmitted last.

The packet of data leaves the transmitting unit 2 and enters the datastream in the ARINC 429 databus 10. The packet of data passes from the datastream to a receiving unit 12.

The data packet enters an input buffer 14 in the receiving unit 12 wherein messages are stored. Receiving units are well known in this area of technology and any receiving unit in this technology can be used with the present invention. The receiving unit 12 is preprogrammed to know which data words are desired, as well as which label designates the keyword.

In accordance with this aspect, one method for the receiving unit 12 to know which data words are desired is to compare or match the keyword provided in the data packet to a keyword preprogrammed at the receiving unit 12. Upon receipt of the keyword in the input buffer 14, the data packet is sent from the input buffer 14 to a packet buffer 18. As a result, the data message to be checked by the CRC is synchronized to the data message for which the CRC was computed. Checking is not dependent on transmission order and all the burdens of tracking are no longer required.

Figure 1:
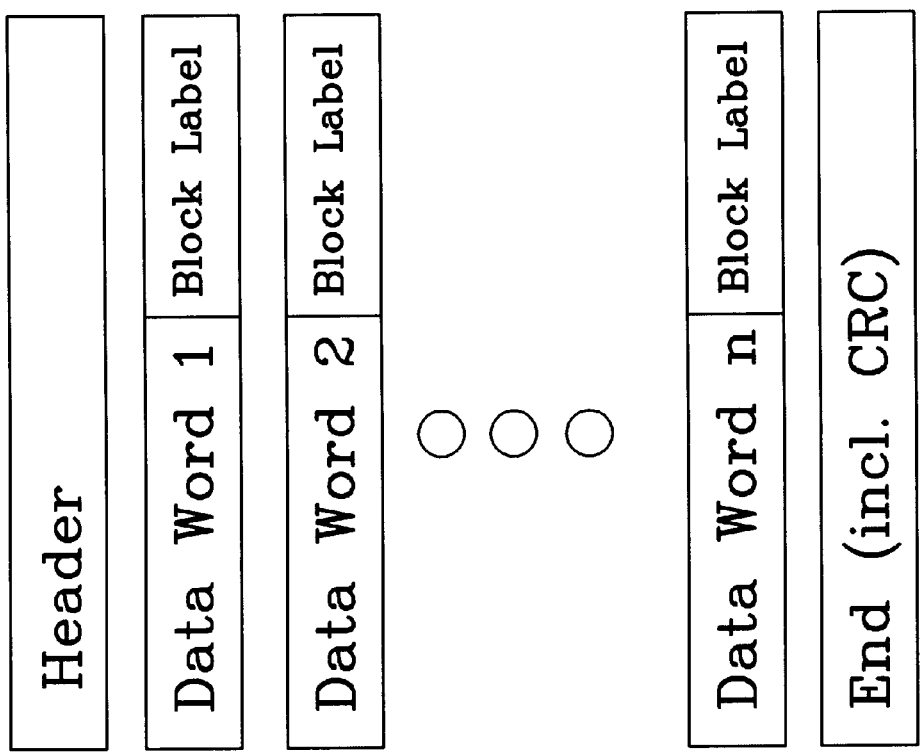
FIG. 1 shows how data was previously transmitted in a block form.
Figure 2:
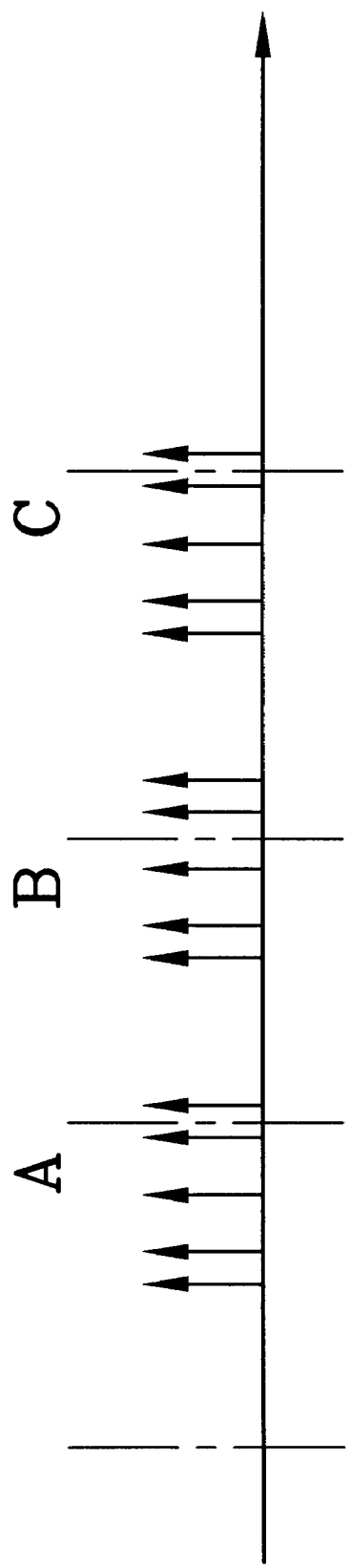
FIG. 2 shows how data was sampled previously.
Figure 4:
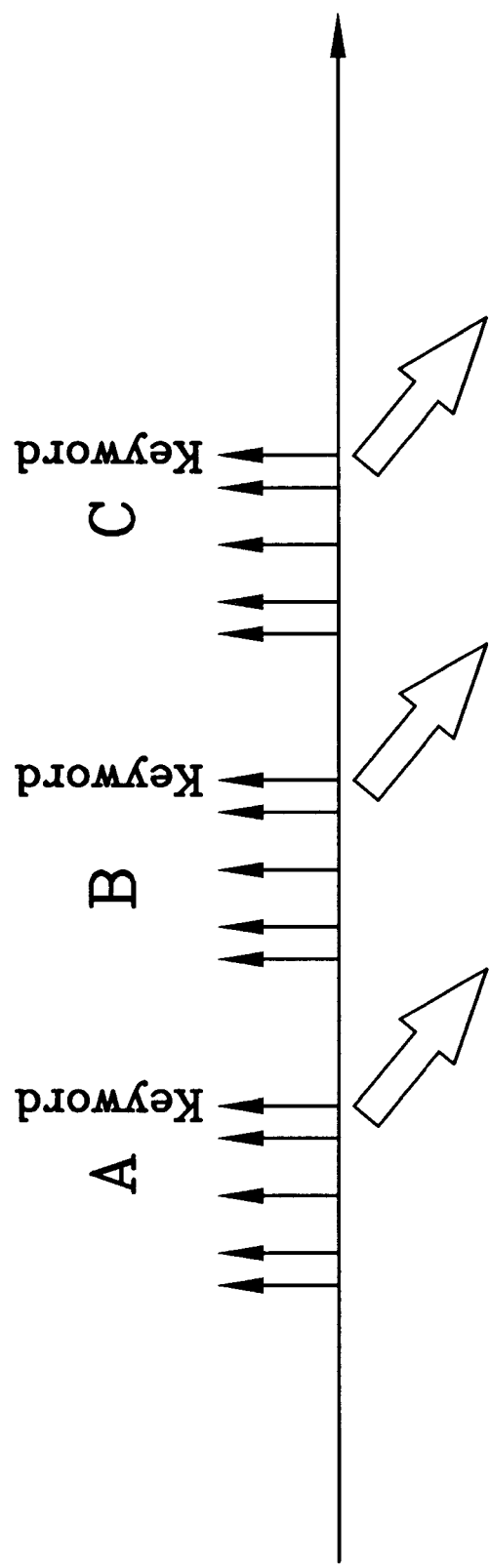
FIG. 4 shows data sampling by present invention.

The keyword is what triggers a data message to be sampled and is designated by a switch 16 in FIG. 3. With the keyword last, the data message is received before the keyword is sampled and therefore, no errors will occur in sampling. FIG. 4 shows the keyword sampling of the present invention. Sampling occurs once a keyword is recognized and with the keyword last, the entire data set, whether it is block A, B, or C is sampled completely as opposed to the asynchronous sampling that was previously performed as shown in FIG. 2.

The selected data message is then sent from the packet buffer 18 to an assembling and comparing means 20 to assemble the message to be checked by the CRC. After the reassembling operation occurs, a CRC is computed from the received message and is compared to the CRC attached to the received message. If the CRCs match, a valid signal is given. Otherwise, an error signal is given. As can be seen, the present invention provides the capability to perform a CRC check in an error free manner.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A method of providing an error detection in data periodically transmitted from a sending unit to a receiving unit, comprising the steps of:

A) inserting a key word at the end of a packet of data
   B) transmitting the packet of data including the key word into a datastream;
   C) receiving the packet of data including the key word from the datastream in the receiving unit; and
   D) performing an error detection on the packet of data only after receipt of said key word.

2. The method of claim 1 wherein prior to step A), the method further comprises the steps of:

i) computing a first check word for a packet of data; and
   ii) sending the first check word with the packet of data.

3. The method of claim 2, wherein the step of performing an error free error detection comprises the steps of:

a) assembling the packet of data;
   b) computing a second check word based on the packet of data;
   c) comparing the second check word with the first check word;
   d) sending a valid signal if the first check word matches the second check word, otherwise sending an error signal if the first check word does not match the second check word.

4. The method of claim 1 wherein the error detection is a CRC.

5. A method of providing an error detection in periodic data transmitted from a sending unit to a receiving unit, comprising the steps of:

A) sending a key word as a last word of a packet of data in a datastream;
   B) receiving the packet of data from the datastream into an input buffer in the receiving unit;
   C) capturing the packet of data as designated by the key word upon receipt of the key word; and
   D) performing an error detection on the packet of data only after the receipt of the key word.

6. The method of claim 5 wherein prior to step A), the method further comprises the steps of:

i) computing a first check word for a packet of data; and
   ii) sending the first check word with the packet of data.

7. The method of claim 6, wherein the step of performing an error free error detection comprises the steps of:

a) assembling the packet of data;
   b) computing a second check word based on the packet of data;
   c) comparing the second check word with the first check word;
   d) sending a valid signal if the first check word matches the second check word, otherwise sending an error signal if the first check word does not match the second check word.

8. The method of claim 5 wherein the error detection is a CRC.

9. An error detection apparatus, comprising:

a sending unit for transmitting data packets, at least one of said data packets comprising a data message and a first keyword wherein said first keyword is attached as a last word of the data message;
   a databus wherein the data packets travel in a datastream of the databus; and
   a receiving unit for retrieving selected data packets, the selected data packets being captured upon receipt of said first keyword which matches a second keyword preprogrammed at the receiving unit, and wherein said receiving unit performs an error detection on the selected data packets only after receipt of the first keyword.

10. The apparatus of claim 9, wherein the databus is an ARINC 429 databus.

11. A method of providing an error detection in data periodically transmitted from a sending unit to a receiving unit, comprising the steps of:

A) sending a packet of data in a data stream, said packet of data being identified by a first keyword at the end of said packet of data;
   B) capturing said packet of data upon receipt of said first keyword, wherein said packet of data captured is synchronized to said packet of data sent by receipt of said first keyword; and
   C) performing an error detection on said packet of data in said receiving unit.

12. The method of claim 11 wherein said step of capturing said packet of data further comprises the steps of:

i) determining whether said first keyword matches a second keyword preprogrammed in the receiving unit; and
   ii) selecting said data packet designated by said first keyword if said first keyword matches said second keyword.

* * * * *